(12) United States Patent
Byquist et al.

(10) Patent No.: US 7,275,939 B2
(45) Date of Patent: Oct. 2, 2007

(54) LOAD COMPENSATOR WITH PRE-LOAD COMPRESSION

(75) Inventors: Tod Byquist, Tukwila, WA (US); Mike S. Brazel, Tacoma, WA (US)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 11/156,836

(22) Filed: Jun. 20, 2005

(65) Prior Publication Data

US 2006/0283182 A1 Dec. 21, 2006

(51) Int. Cl.
 *H01R 12/00* (2006.01)
(52) U.S. Cl. ........................................ 439/73
(58) Field of Classification Search ............... 439/67, 439/73, 58, 71, 331, 487, 72; 361/718, 720, 361/721, 487
See application file for complete search history.

(56) References Cited

U.S. PATENT DOCUMENTS

| 5,807,104 A | * | 9/1998 | Ikeya et al. ............... 439/73 |
| 6,317,924 B1 | * | 11/2001 | Gallagher ............... 16/114.1 |
| 6,386,890 B1 | * | 5/2002 | Bhatt et al. ............... 439/67 |
| 7,190,590 B2 | * | 3/2007 | Karuishi ............... 361/719 |

\* cited by examiner

*Primary Examiner*—Phuong Dinh
(74) *Attorney, Agent, or Firm*—Buckley, Maschoff & Talwalkar LLC

(57) ABSTRACT

According to some embodiments, at least one spring element is provided for a load compensator along with a restraining portion that maintains a pre-load compression for the spring element. Moreover, at least one surface may be provided to transfer force associated with an integrated circuit and a set of electrical contacts.

16 Claims, 17 Drawing Sheets

LOAD COMPENSATOR WITH PRE-LOAD COMPRESSION

BACKGROUND

An Integrated Circuit (IC) package may electrically couple an IC die to external components and circuitry. For example, electrical contacts of an IC die may be coupled to electrical contacts of an IC package, which are in turn electrically connected to external contacts of the IC package. The external contacts of the IC package may comprise pins, solder balls or other types of contacts.

The external contacts of an IC package may be mounted directly to electrical contacts of a substrate, such as a circuit board. In some cases, a sockets may removably attach an IC package to electrical contacts of a substrate. For example, electrical contacts of an IC package may be removably coupled to first contacts of a socket, and second contacts of the socket may be coupled to a substrate.

To facilitate a good electrical connection between package and socket contacts, a load compensator may apply a force to bias contacts of the socket against corresponding contacts of the package.

DETAILED DESCRIPTION

Figure 1:
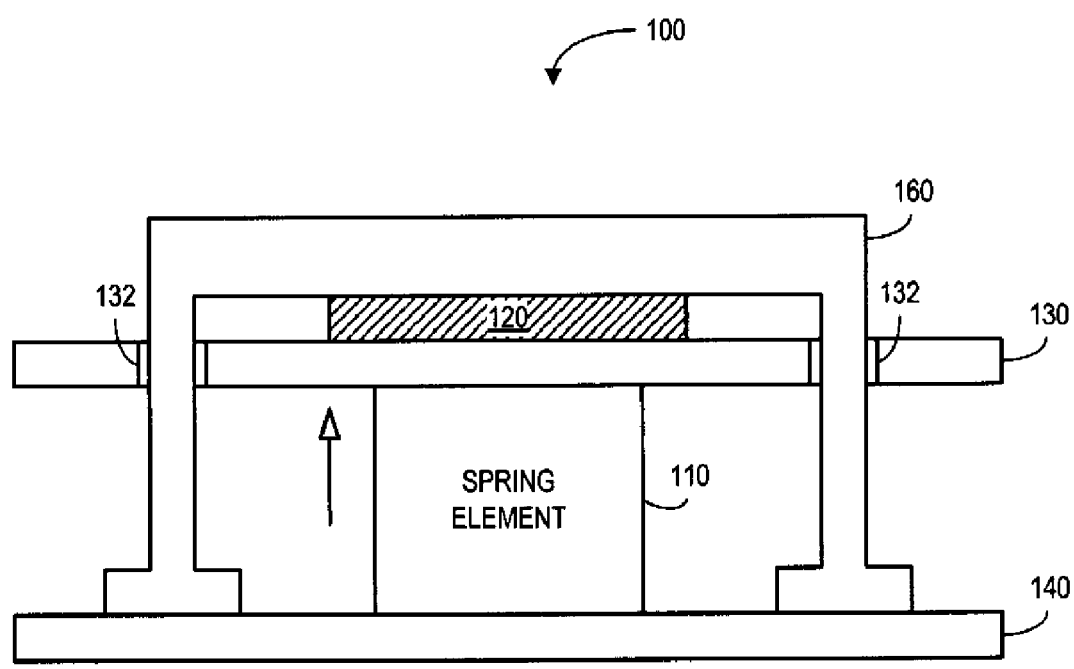
FIG. 1 is a block diagram of an apparatus.

FIG. 1 is a block diagram of an apparatus 100 wherein a spring element 110 provides a force to facilitate an electrical coupling between an IC 120 (e.g., an IC package and/or an IC socket) and a circuit board 130. In particular, the spring element 110 is mounted on a support plate 140. A backing element 160 is also mounted on the support plate 140. The backing element 160 may, for example, pass through holes 132 in the circuit board 130.

The IC 120 is located between the backing element 160 and the circuit board 130. The spring element 110 is located on the side of the circuit board 130 opposite the IC 120 and, as a result, will provide a force (upwards in FIG. 1) that pushes the circuit board 130 into the IC 120. In this way, an electrical connection between contacts on the bottom surface of the IC 120, such as Land Grid Array (LGA) or solder ball joint contacts, and contacts on the top surface of the circuit board 130 may be facilitated.

The amount of force provided by the spring element 110 may depend of the softness of the spring element 110 and the amount of compression applied to the spring element 110 by the support plate 140 and the circuit board 130. In general, the amount of force pushing the circuit board 130 against the IC 120 increases as the compression of the spring element 110 increases.

Figure 2:
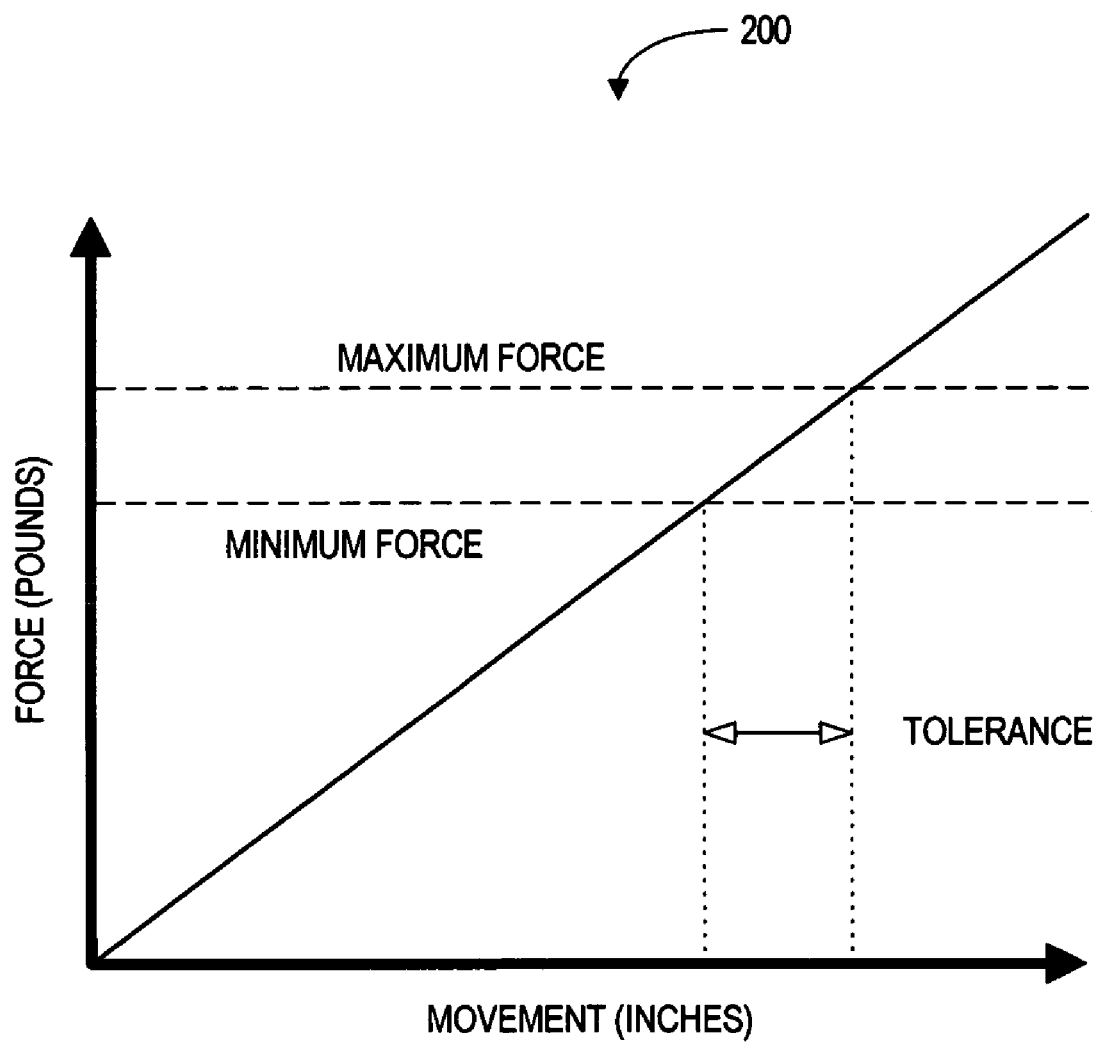
FIG. 2 is a graph illustrating changes in force associated with a spring element.

FIG. 2 is a graph 200 illustrating changes in force associated with the spring element 110. Note that the force or compression load provided by the spring element 110 increases linearly as the compression of the spring element 110 increases (e.g., the movement or "stroke" of the spring increases).

Also note that note that a minimum amount of force may be needed to provide an adequate electrical connection. When not enough force is provided by the spring element 110, the resistance between the IC 120 contacts and circuit board 130 contacts might be too high. Moreover, there may be maximum amount of force that is appropriate for a system design. For example, applying too much force could eventually damage the IC 120 and/or the circuit board 130. As a result of these minimum and maximum forces, there may be manufacturing and/or assembly tolerances associated with the softness of the spring element 110 (as well as the width and stiffness of various components of the apparatus 100).

Figure 3:
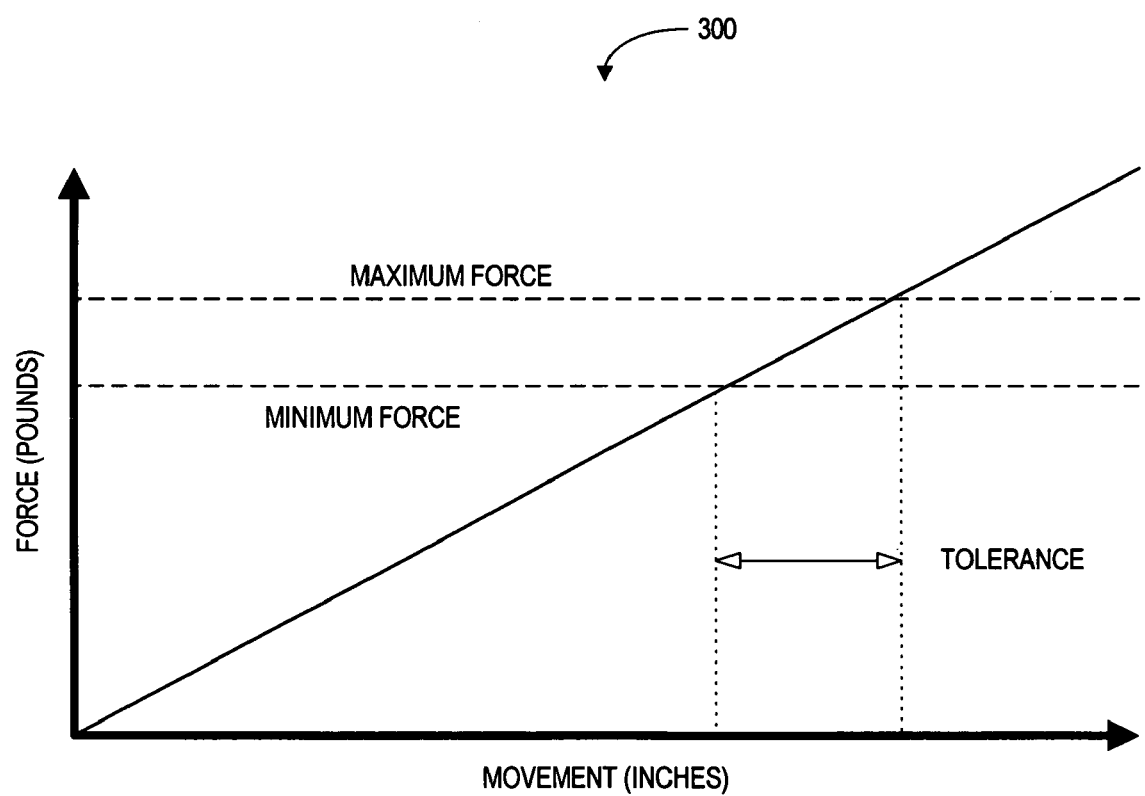
FIG. 3 is a graph illustrating changes in force associated with a softer spring element.

FIG. 3 is a graph 300 illustrating changes in force associated with a softer spring element. Although the softer spring element may allow for increased manufacturing and/or assembly tolerances, note that a greater movement of the spring element may be required to provide an appropriate minimum force. That is, the softer spring element may need to be compressed a greater distance to sufficiently couple an IC to a circuit board. This increased distance may make designs with softer springs impractical. For example, it might be difficult to accommodate the increased distance when assembling a relatively small device, such as a mobile computer.

Figure 4:
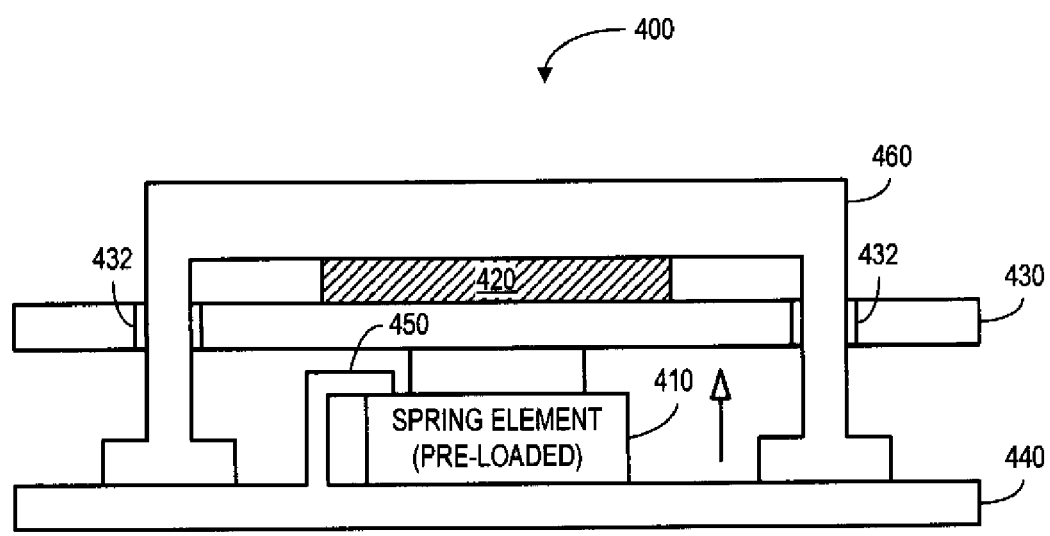
FIG. 4 is a block diagram of an apparatus according to some embodiments.

FIG. 4 is a block diagram of an apparatus 400 wherein a spring element 410 provides a force to facilitate an electrical coupling between an IC 420 (e.g., an IC package and/or an IC socket) and a circuit board 430. As before, the spring element 410 and a backing element 460 are mounted on the support plate 440. The backing element 460 may, for example, pass through holes 432 in the circuit board 430.

The IC 420 is located between the backing element 460 and the circuit board 430. The spring element 410 is located on the side of the circuit board 430 opposite the IC 420 and, as a result, provides a force (upwards in FIG. 1) that pushes the circuit board 430 against the IC 420. In this way, an electrical connection between contacts on the bottom surface of the IC 420, such as LGA or solder ball joint contacts, and contacts on the top surface of the circuit board 430 may be facilitated.

According to some embodiments, at least one restraining portion 450 is provided to maintain or "lock in" a pre-load compression for the spring element 410. For example, the spring element 410 may be partially compressed and placed under the restraining portion 450 (or the restraining portion 450 may be placed over the compressed spring element 410 and then be attached to, for example, the support plate 440).

Figure 5:
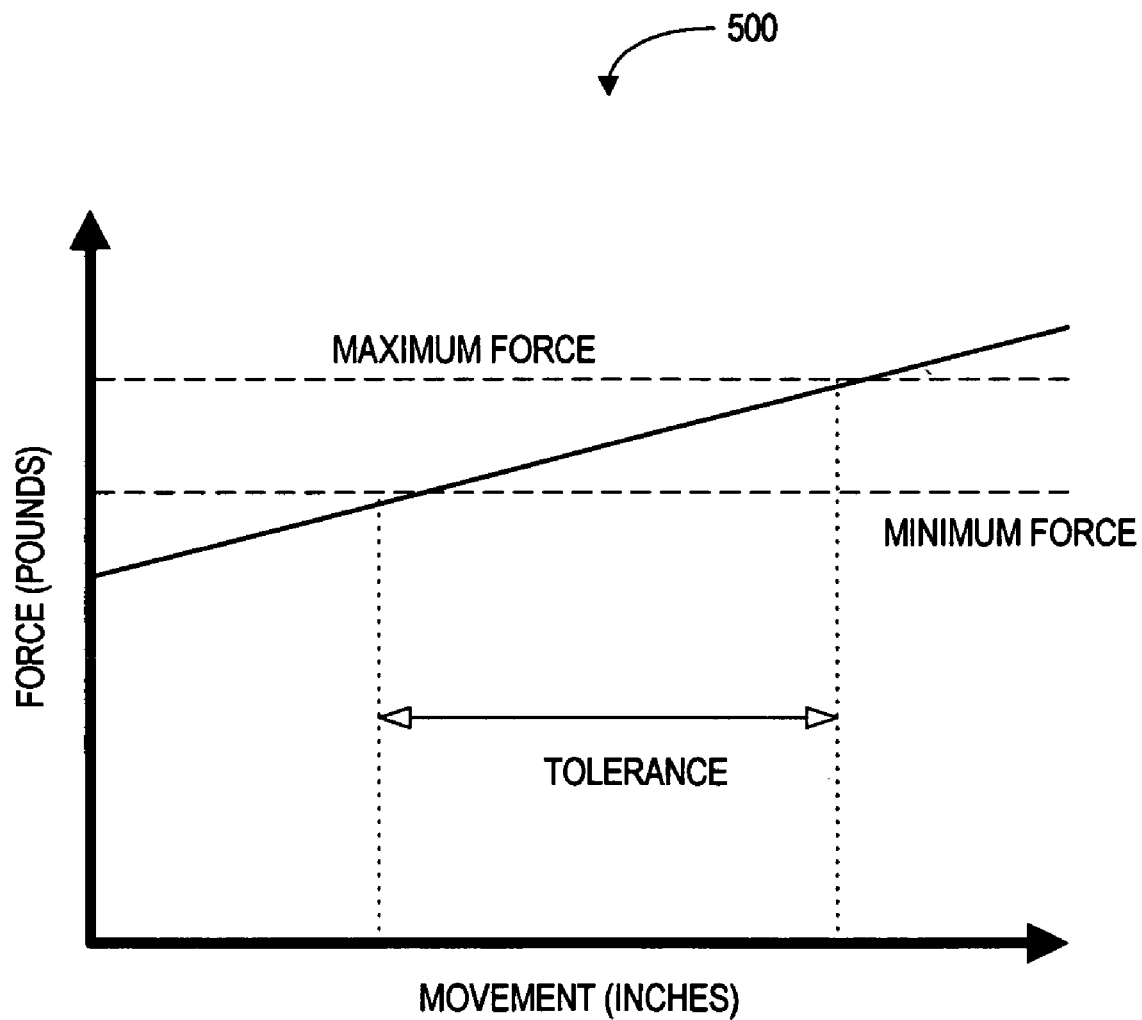
FIG. 5 is a graph illustrating changes in force associated with a spring element according to some embodiments.

FIG. 5 is a graph 500 illustrating changes in force associated with the spring element 410 according to this embodiment. Because of the pre-load compression, the initial force required to move the spring element 410 may be substantial (e.g., non-zero). As a result, a relatively soft spring element may be used in the apparatus 400, but the amount of movement needed to generate a minimum force may be reduced (and manufacturing and/or assembly tolerances may also be relaxed). The relatively narrow load range associated with such a design may also increase the number of contacts associated with an IC and/or improve power delivery to the IC.

Although the graph 500 illustrates that the linear force/ movement line intersects the force axis at a non-zero value, note that a relatively small amount of compression or sway of other elements of an actual apparatus (e.g., socket and motherboard compression) may provide a multi-linear plot. In this case, a first portion of the plot might have a relatively high slope (and the portion may be relative narrow, because the amount of movement provided by compression of the motherboard, for example, may be minor) and a subsequent portion may have a substantially lower slope (representing compression of the actual spring element).

Figure 6:
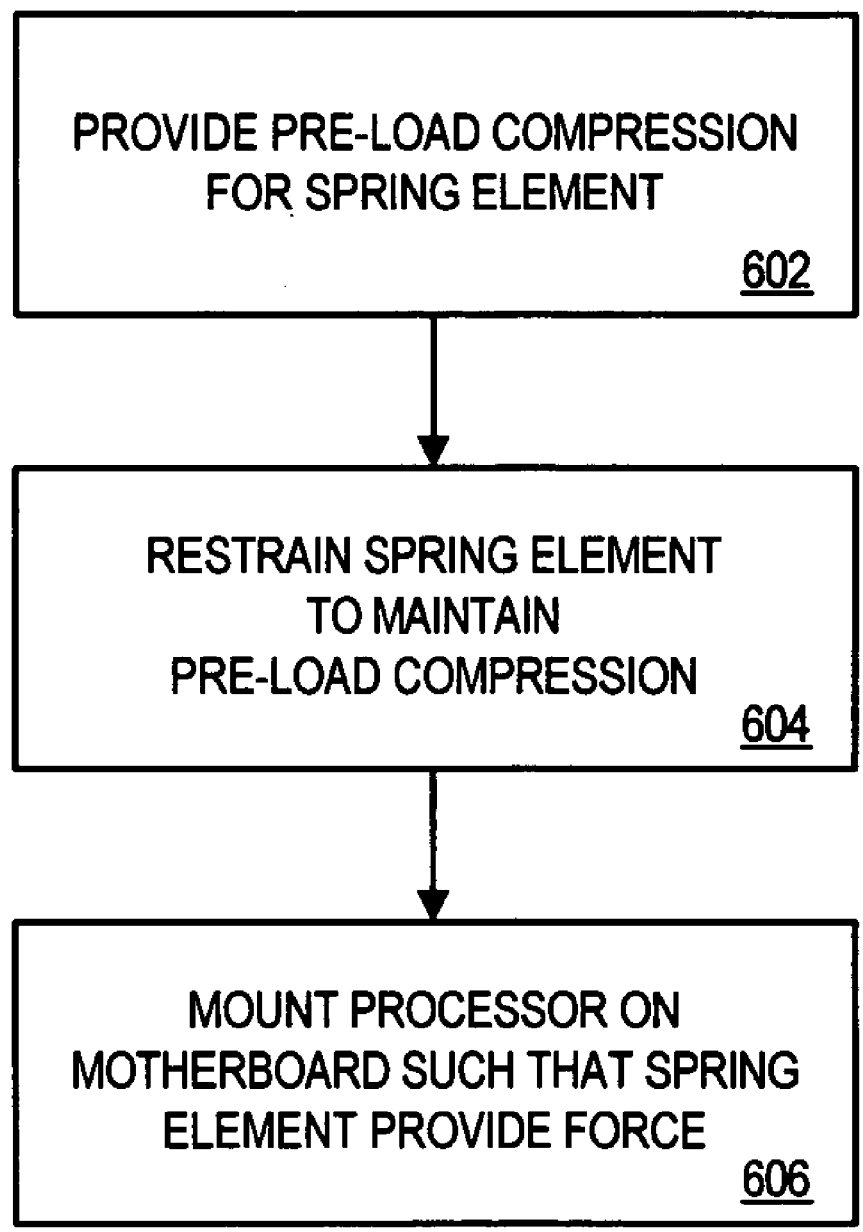
FIG. 6 is a flow chart of a method according to some embodiments.

FIG. 6 is a flow chart of a method according to some embodiments. At 602, a pre-load compression is provided for a spring element. At 604, the spring element is restrained to maintain the pre-load compression. Actions 602 and 604 might be associated with, for example, assembling a load compensator outside of a chassis. At 606, a processor is mounted on a motherboard such that the spring element will provide a force to facilitate an electrical connection between them.

Figure 7:
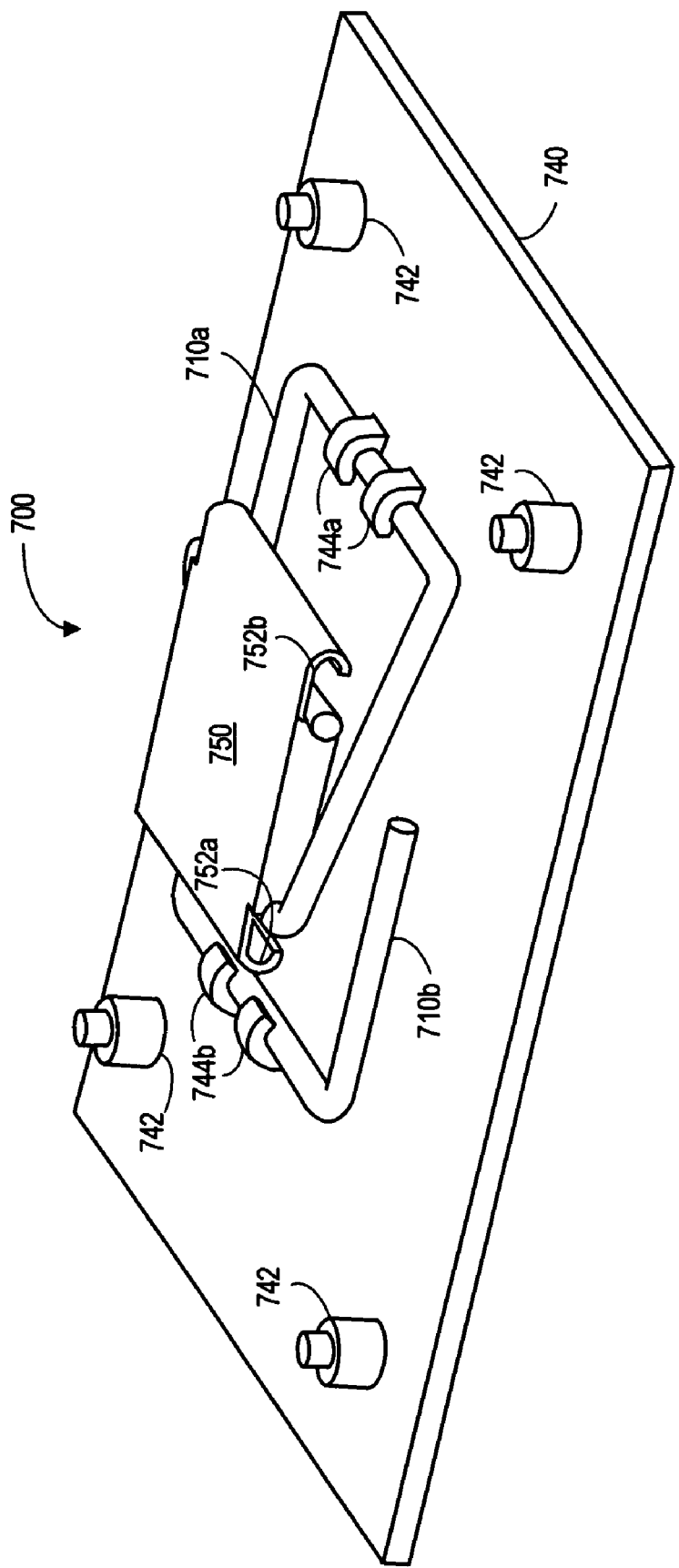
FIG. 7 is an isometric view of a load compensator according to some embodiments.

FIG. 7 is an isometric view of a load compensator 700 according to some embodiments. The load compensator 700 includes a support plate 740 having mounting elements 742. The mounting elements 740 may, for example, be used to attach a backing element to the support plate 740.

The load compensator 700 also includes two torsion springs 710a, 710b and a reaction plate 750 having two notches or slots 752a, 752b, each slot 752a, 752b being adapted to removably receive an end of one of the springs 710a, 710b. The torsion springs 710a, 710b and the reaction plate 750 may, for example, mass produced, low cost sheet metal components. According to some embodiments, an insulating layer is provided on the top surface of the reaction plate 750. The other end of each spring 710a, 710b may be affixed to the support plate 740 by holders 744a, 744b. The holders 744a, 744b might comprise, for example, clips or sheet metal forms.

Figure 8:
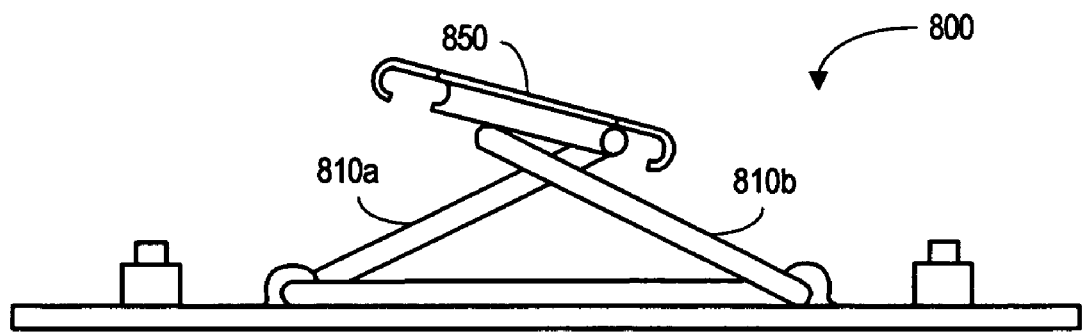
FIGS. 8-10 are side views of a load compensator according to some embodiments.
Figure 9:
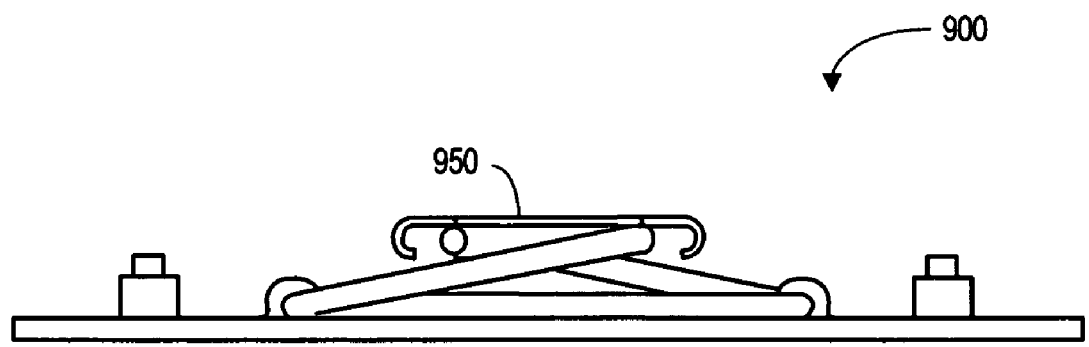
Figure 10:
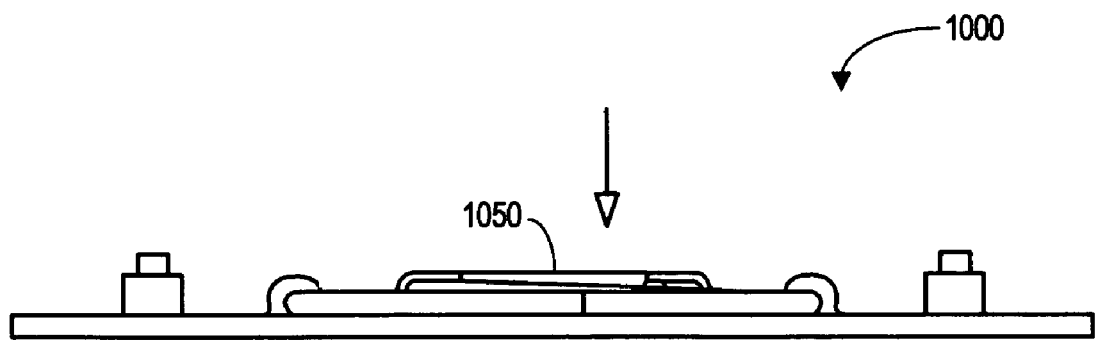

FIG. 8 is a side view of a partially assembled load compensator 800 according to some embodiments. In this case, an end of one spring 810a has been inserted into a slot of a reaction plate 850. For example, the end of the spring 810a might be snapped into the slot. As illustrated in FIG. 9, an end of the other spring may then be inserted into the other slot of the reaction plate 950 (e.g., by snapping the end into the slot using a press). As a result, an amount of pre-load tension will be present in the springs (due to the fact that the reaction plate 950 is pulling them together). When sufficient additional force is applied to the reaction plate 950, the springs and reaction plate 1050 may be pushed down as illustrated in FIG. 10.

Figure 11:
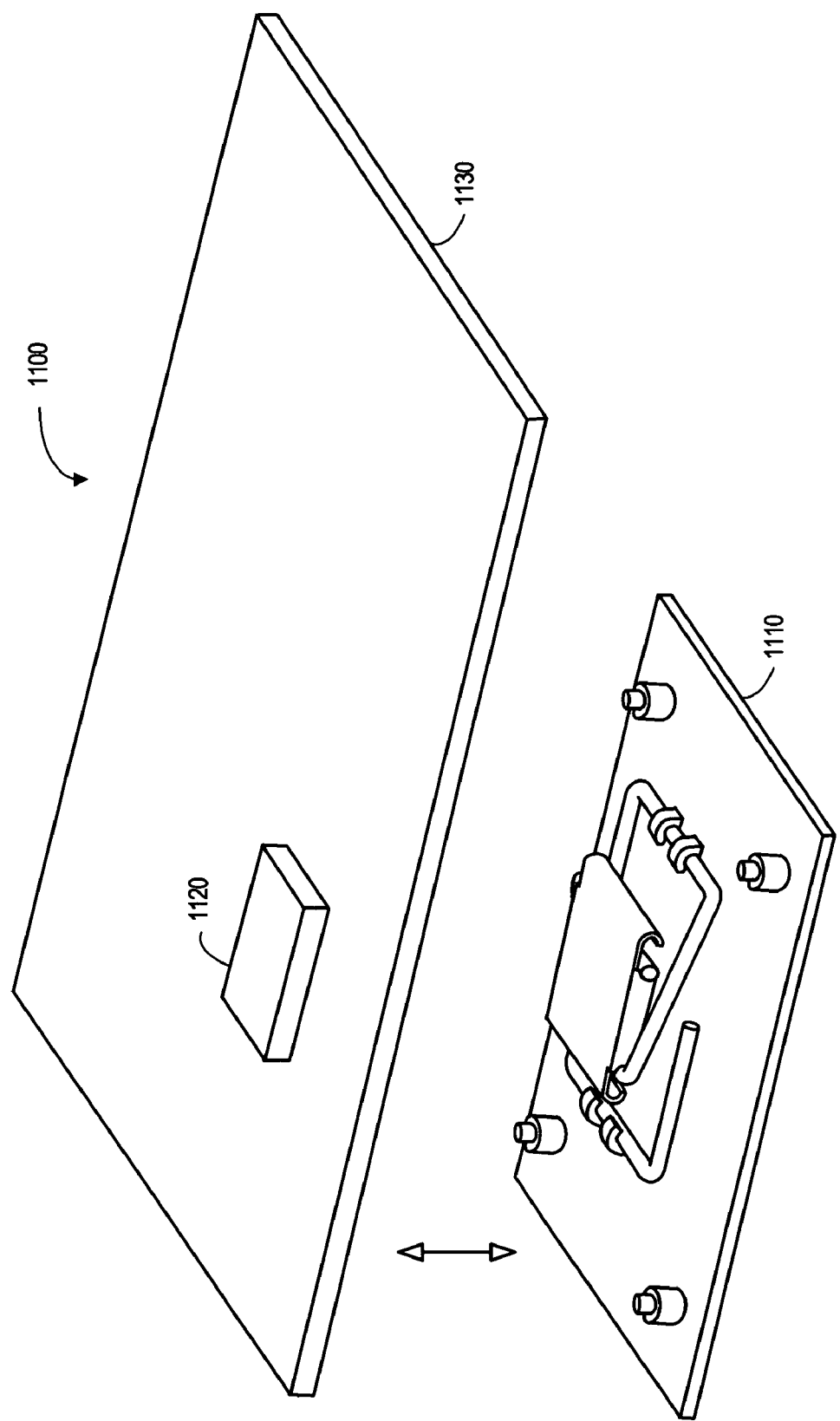
FIG. 11 is an isometric view of a load compensator, motherboard, and IC according to some embodiments.

The top surface of the reaction plate 1050 may now be used to transfer force associated with an IC (e.g., a processor and socket) and a set of electrical contacts. For example, FIG. 11 is an isometric view 1100 of a load compensator 1110, motherboard 1130, and IC 1120 (package or socket) according to some embodiments. The load compensator 1110 and IC 1120 may be positioned on opposite sides of the motherboard 1130, and the resulting force provided by the two torsion springs in the load compensator 1110 (when compressed) may push the motherboard 1130 against the IC 1120. According to some embodiments, the load compensator 1110 may provide from approximately 85 to approximately 125 pounds of force over a 0.25 range of movement.

Figure 12:
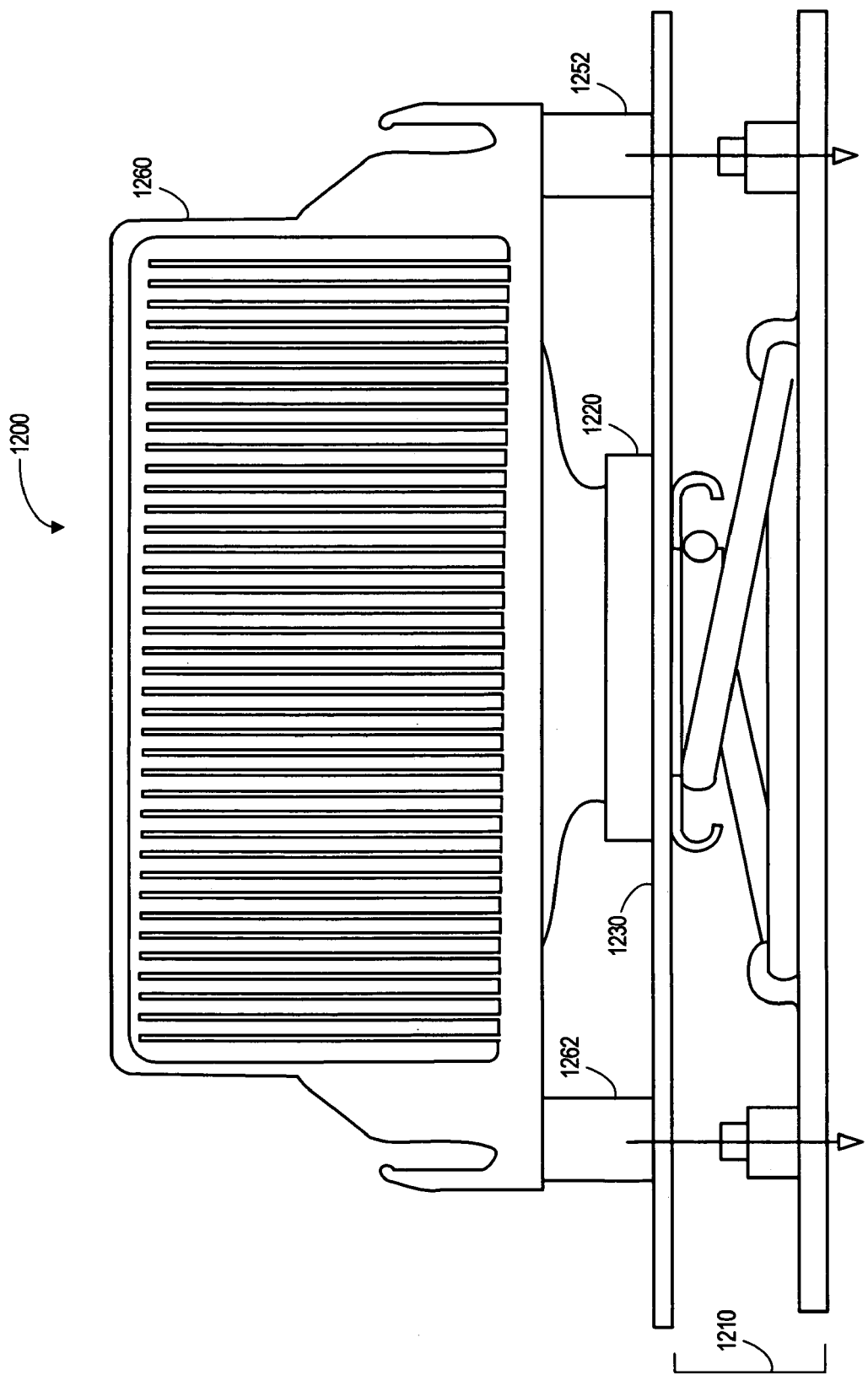
FIG. 12 is a side view including a load compensator and a heat sink according to some embodiments.

FIG. 12 is a side view 1200 including a load compensator 1210 and a heat sink 1260 according to some embodiments. In this case, the load compensator 1210 and an IC 1220 are located on opposite sides of a motherboard 1230. Moreover, the heat sink 1260 is located on the side of the IC 1220 opposite the motherboard 1230. To assemble the apparatus, mounts 1262 attached to the heat sink 1260 may be adapted to be attached to mounts of the load compensator 1210 (e.g., through holes in the motherboard 1230 not illustrated in FIG. 12).

Figure 13:
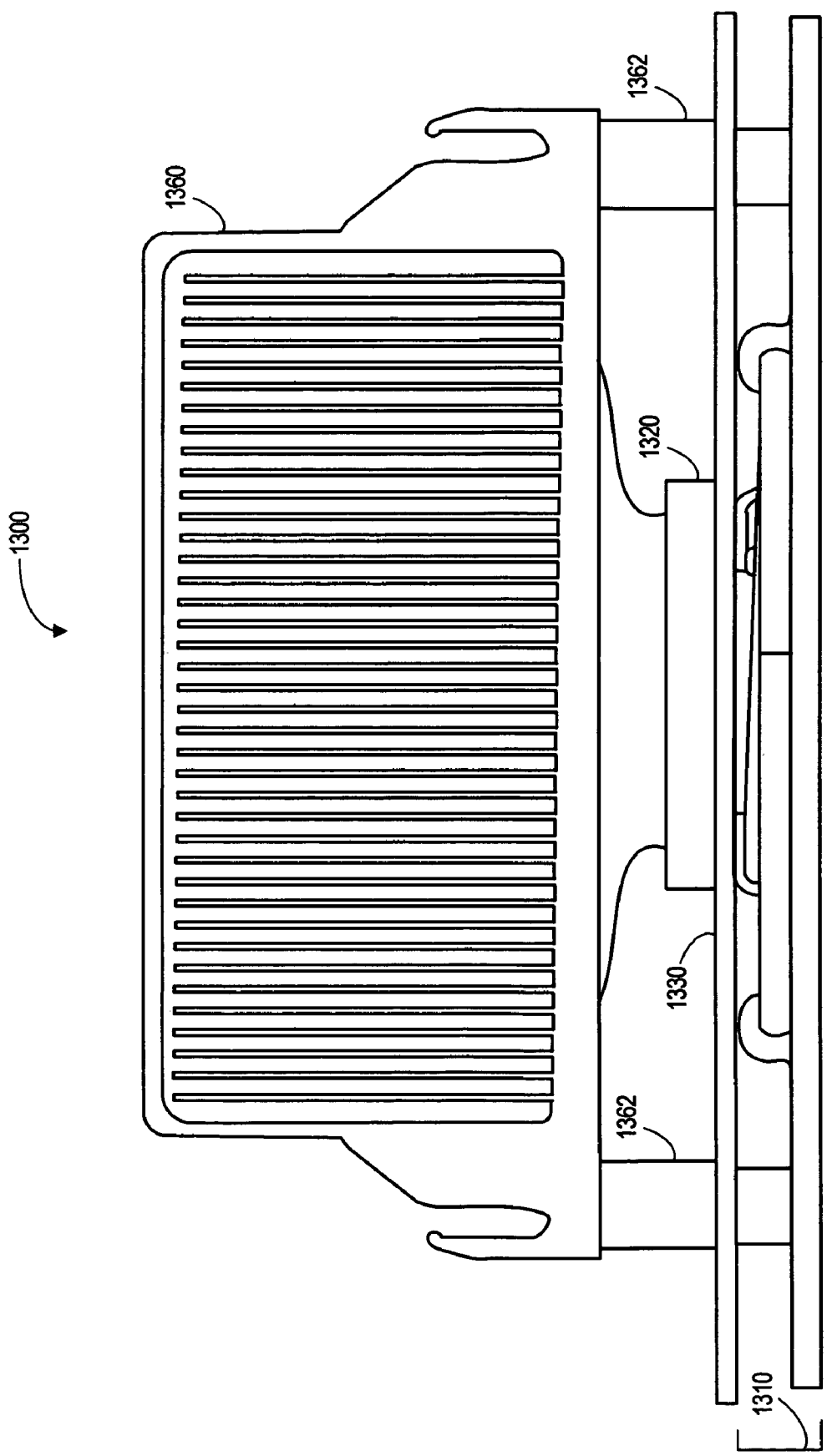
FIG. 13 is a side view including an assembled load compensator and heat sink according to some embodiments.

FIG. 13 is a side view including an assembled load compensator 1310 and heat sink 1360 according to some embodiments. In particular, the mounts 1362 of the heat sink 1360 have been attached to mounts of the load compensator 1310 (e.g., using screws). According to some embodiments, the load compensator 1310 is pre-assembled outside of a chassis. The load compensator 1310 is then placed into a chassis pan and a motherboard 1230 is installed. The IC 1220 (e.g., a processor in a socket) is placed on the motherboard 1230 and the heat sink 1260 is attached via the mounts 1362 (which compresses the load compensator 1310 an appropriate amount).

In this way, a bottom surface of the heat sink 1360 may act as a backing element while a top surface of the load compensator 1310 acts as a reaction plate (e.g., and an appropriate force may be applied to press the IC 1320 and the motherboard 1330 together).

Figure 14:
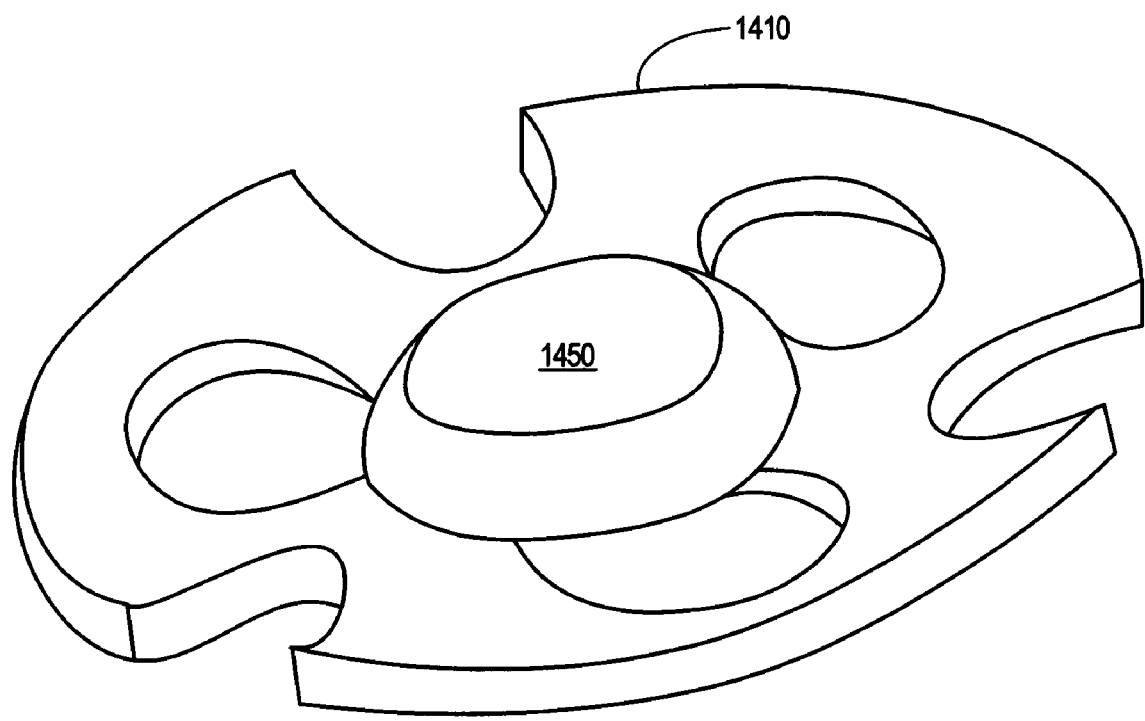
FIG. 14 illustrates a cloverleaf spring element.

Although some embodiments described herein have used torsion spring elements, not that other types of spring elements may be used. For example, a load compensator may use a pre-loaded axial spring element to provide an appropriate amount of force. FIG. 14 illustrates one type of axial spring element, referred to herein as a "cloverleaf" spring element 1410. The cloverleaf spring element 1410 may, for example, comprise a concave disk of sheet metal. A circular hole near the center of the cloverleaf spring element 1410 (not illustrated in FIG. 14) may be pressed over, and be restrained by, a head 1450 of a post.

Figure 15:
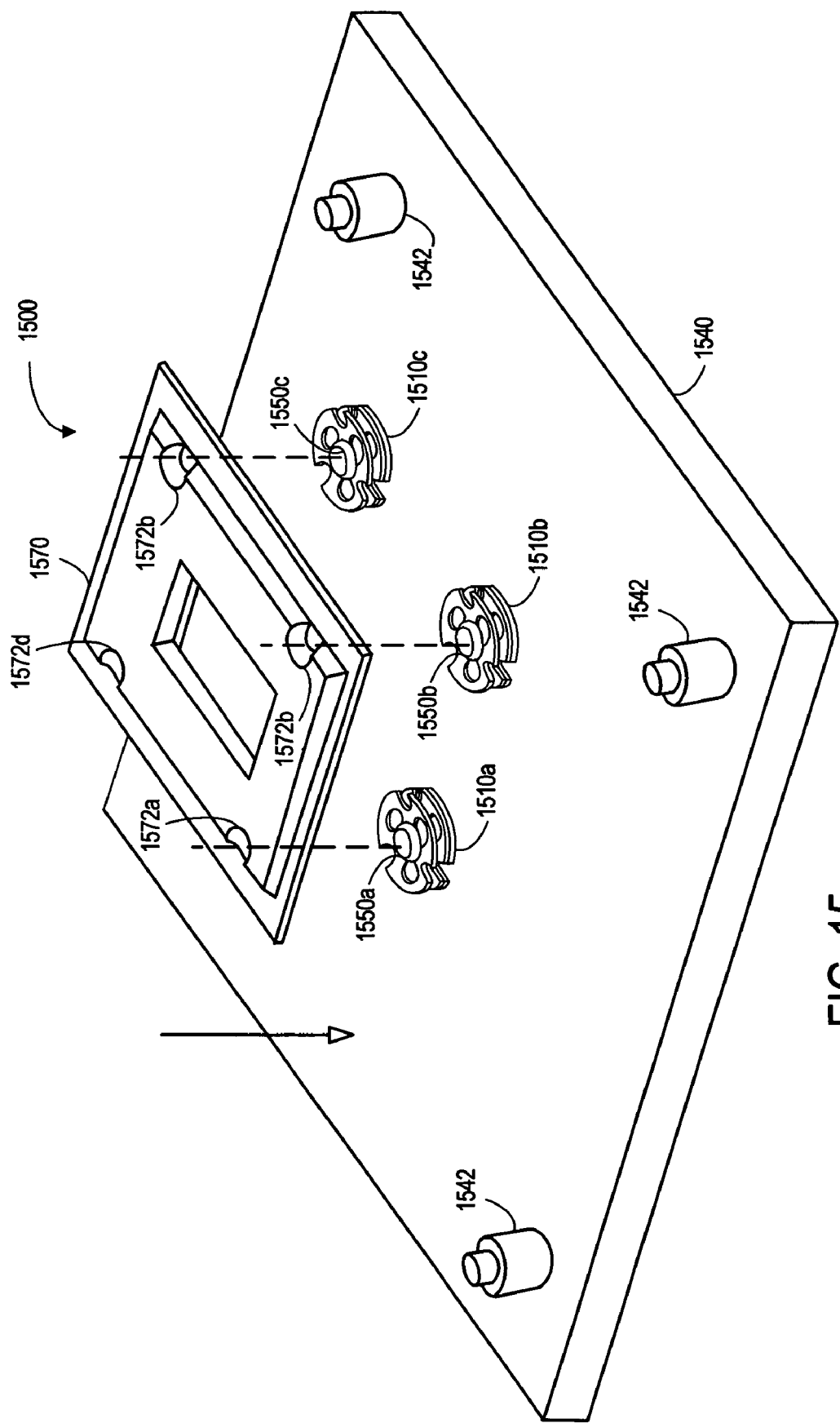
FIG. 15 is an isometric view of a load compensator according to another embodiment.

FIG. 15 is an isometric view of a load compensator 1500 using multiple sets cloverleaf spring elements 1510a, 1510b, 1510c, 1510d (note that 1510d is not illustrated in FIG. 15 for clarity) mounted on a support plate 1540 according to some embodiments. The support plate 1540 may also include a number of mounting elements 1542 (e.g., to be affixed to a backing element or heat sink).

The sets of spring elements 1510a, 1510b, 1510c, 1510d may, for example, be pre-loaded with an amount of compression which is held in place by restraining posts 1550a, 1550b, 1550c, 1550d. A backing plate 1570 may be positioned over the sets of spring elements 1510a, 1510b, 5110c, 1510d and may include holes 1572a, 1572b, 1572c, 1572d (e.g., to receive the restraining posts 1550a, 1550b, 1550c, 1550d). The backing plate 1570 may, for example, transfer a force provided by the sets of spring elements 1510a, 1510b, 1510c, 1510d to a motherboard. According to some embodiments, the backing plate 1570 is formed of or coated with an insulating material.

Note that in the embodiment described with respect to FIG. 7, the reaction plate 750 acted both to restrain the spring elements 710a, 710b and to transfer force to a motherboard. In the embodiment described with respect to FIG. 15, different elements perform these different functions. In particular, the restraining posts 1550a, 1550b, 1550c, 1550d restrain the spring elements 1510a, 1510b, 1510c, 1510d while the backing plate 1570 transfers the force.

Figure 16:
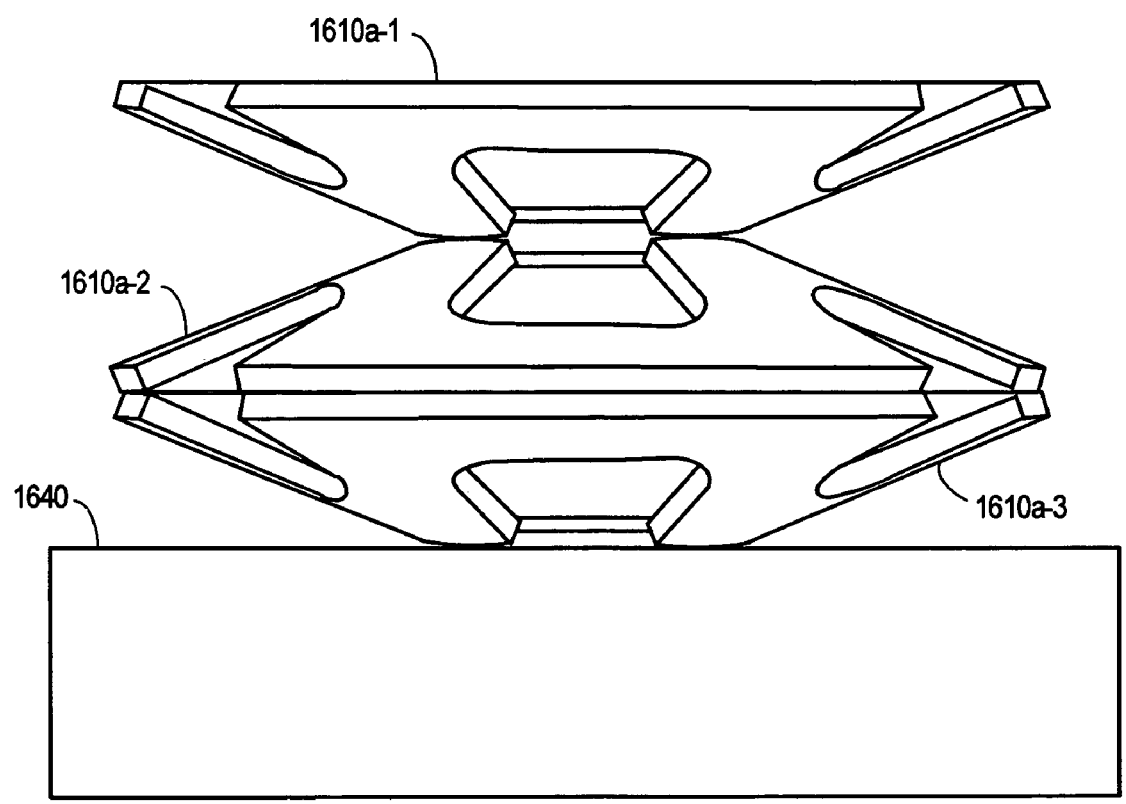
FIGS. 16-18 are side views of a set of spring elements according to some embodiments.
Figure 17:
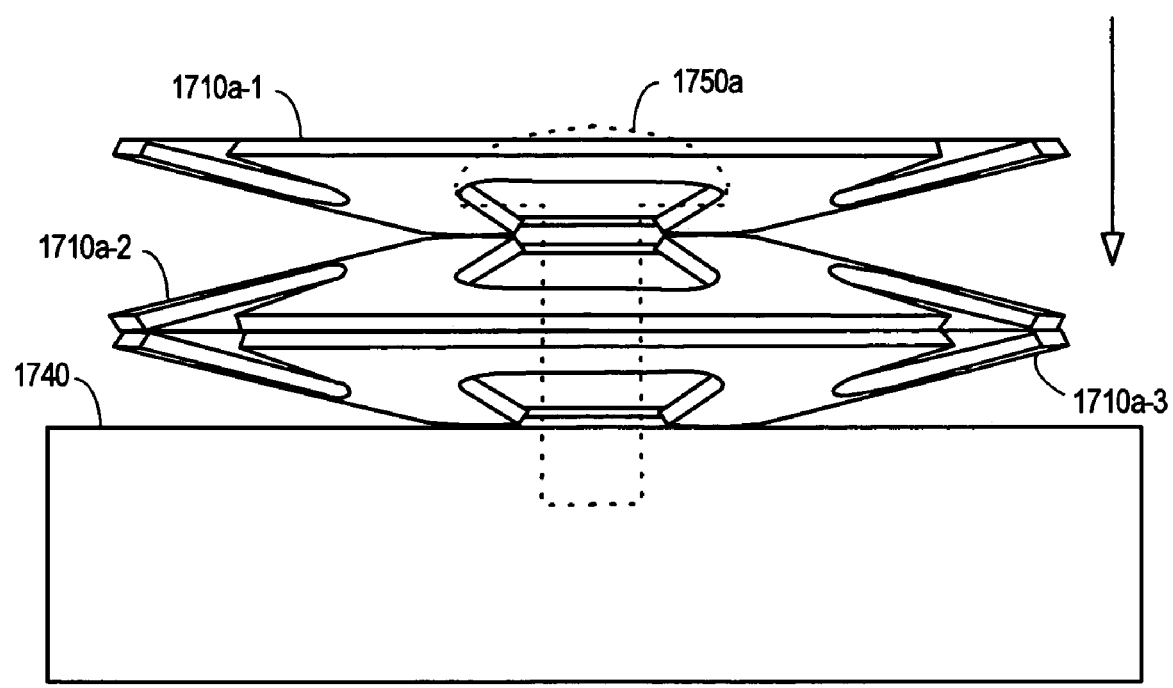
Figure 18:
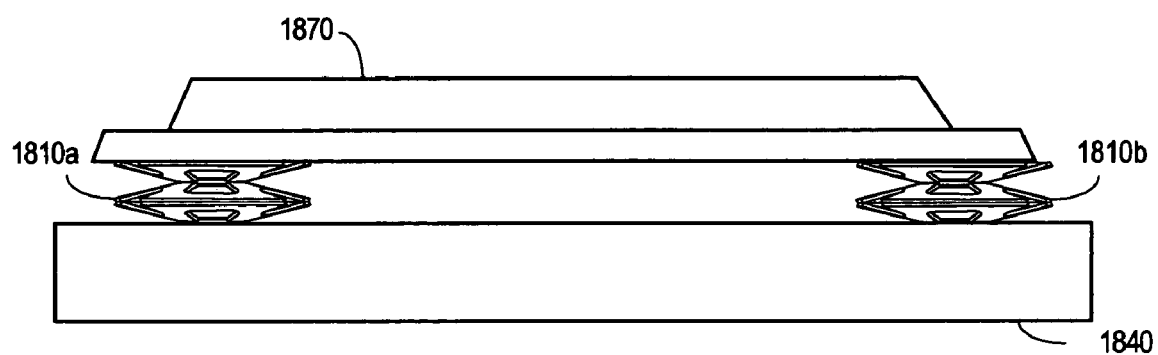

FIG. 16 illustrates how a set of three (uncompressed) spring elements 1610a-1, 1610a-2, 1610a-3 may be arranged on a support plate 1640. According to this embodiment, the orientation of the center spring element 1610a-2 is reversed as compared to the top spring element 1610a-1 and bottom spring element 1610a-3. FIG. 17 illustrates how a set of three (compressed) spring elements 1710a-1, 1710a-2, 1710a-3 may be arranged on a support plate 1740. In this case, a post 1750a is attached to the support plate 1740. Moreover, the center of the spring elements 1610a-1, 1610a-2, 1610a-3 have openings that have been pushed over the post 1750a. The post 1750a may include a head with a width (e.g., a diameter) that is slightly longer as compared to these openings. As a result, when the top spring element 1710a-1 is pressed down and snapped into place, a pre-load compression of the three spring elements 1610a-1, 1610a-2, 1610a-3 may be maintained. FIG. 18 illustrates how a backing plate may be placed on sets of spring elements 1810a, 1810b after they have been pre-loaded with compression.

Figure 19:
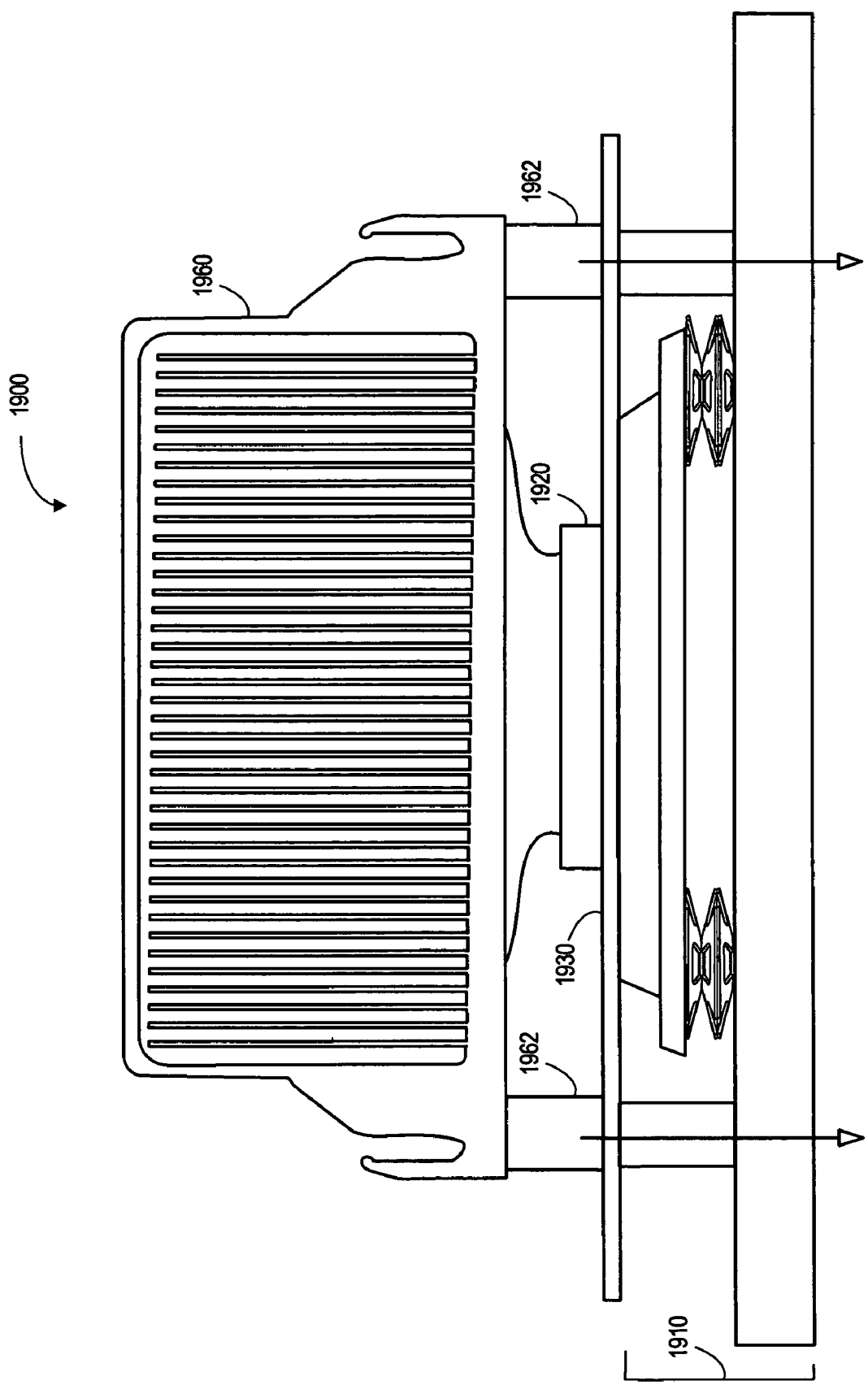
FIG. 19 is a side view including an assembled load compensator and heat sink according to some embodiments.

FIG. 19 is a side view 1900 including an assembled load compensator 1910 and heat sink 1960 according to some embodiments. In this case, the load compensator 1910 and an IC 1920 are located on opposite sides of a motherboard 1930. Moreover, the heat sink 1960 is located on the side of the IC 1920 opposite the motherboard 1930. To assemble the apparatus, mounts 1962 on the heat sink 1960 may be attached to mounts of the load compensator 1910 (e.g., through holes in the motherboard 1930 not illustrated in FIG. 19). In this way, a bottom surface of the heat sink 1960 may act as a backing element while a top surface of the load compensator 1910 acts as a reaction plate (e.g., and an appropriate force may be applied to press the IC 1920 and motherboard 1930 together).

Thus, various embodiments of the present invention may provide a load compensator with a pre-loaded amount of compression, which may be appropriate for small form factors and/or improve tolerance requirements associated with various system components. Moreover, embodiments may be provided using simple elements which may allow for mass production of load compensators at relatively low cost.

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, although particular spring elements have been described herein, other spring elements may be used in connection with any of the embodiments. Similarly, although particular arrangements of components have been described, other arrangements may be provided. For example, a pre-loaded spring element may be provided on a side of an IC opposite a motherboard (and, in this arrangement, may "push" down on the IC).

The several embodiments described herein are solely for the purpose of illustration. Persons skilled in the art will recognize from this description other embodiments may be practiced with modifications and alterations limited only by the claims.

What is claimed is:

1. An apparatus, comprising:
a torsion spring;
a reaction plate maintaining a pre-load compression for the torsion spring, the reaction plate including a slot adapted to removably receive a first portion of the torsion spring; and
at least one surface to transfer force associated with an integrated circuit and a set of electrical contacts.

2. The apparatus of claim 1, wherein the torsion spring comprises a first torsion spring and the slot comprises a first slot adapted to removable receive a first portion of the first torsion spring and further comprising:
a second torsion spring, wherein the reaction plate includes a second slot adapted to removably receive a first portion of the second torsion spring.

3. The apparatus of claim 1, wherein the at least one surface is associated with a face of the reaction plate.

4. The apparatus of claim 3, further comprising:
a motherboard proximate and parallel to the face of the reaction plate; and
an integrated circuit proximate and parallel to the motherboard, on a side of the motherboard opposite the face of the reaction plate.

5. The apparatus of claim 2, further comprising:
a support plate substantially parallel to the reaction plate and affixed to a second portion of the first torsion spring and a second portion of the second torsion spring, wherein the first and second portions of the first torsion spring are located opposite a torsion portion of the first torsion spring and further wherein the first and second portions of the second torsion spring are located opposite a torsion portion of the second torsion spring.

6. The apparatus of claim 5, wherein the support plate is substantially parallel to the reaction plate.

7. The apparatus of claim 6, further comprising:
a motherboard proximate and parallel to the face of the reaction plate;
an integrated circuit proximate and parallel to the motherboard, on a side of the motherboard opposite the face of the reaction plate; and
a heat sink unit proximate and parallel to the integrated circuit, on a side of the integrated circuit opposite the motherboard, wherein the heat sink unit includes an attaching portion adapted to be coupled to an attaching portion of the support plate.

8. An apparatus, comprising:
multiple sets of cloverleaf axial spring elements;
a post having a head, the head having a slightly larger width than an opening in a cloverleaf spring element, the post maintaining a pre-load compression for at least one set of the spring elements; and
at least one surface to transfer force associated with an integrated circuit and a set of electrical contacts.

9. The apparatus of claim 8, wherein the at least one surface is associated with a backing plate.

10. The apparatus of claim 9, farther comprising:
a motherboard;
an integrated circuit proximate and parallel to the motherboard; and a heat sink unit proximate and parallel to the integrated circuit, on a side of the integrated circuit opposite the motherboard.

11. The apparatus of claim 9, wherein the multiple sets cloverleaf axial spring elements are to provide a relatively high amount of initial force after a relative small amount of movement from an initial position, and then to gradually increase the amount of force provided as the movement increases beyond the initial position.

12. The apparatus of claim 11, wherein the initial position is associated with the post.

13. The apparatus of claim 11, wherein the amount of force provided is between approximately 85 and approximately 125 pounds and the amount of movement from the initial position is approximately 0.25 inches.

14. The apparatus of claim 1, wherein the torsion spring element is to provide a relatively high amount of initial force after a relative small amount of movement from an initial position, and then to gradually increase the amount of force provided as the movement increases beyond the initial position.

15. The apparatus of claim 14, wherein the initial position is associated with the reaction plate.

16. The apparatus of claim 14, wherein the amount of force provided is between approximately 85 and approximately 125 pounds and the amount of movement from the initial position is approximately 0.25 inches.

* * * * *